US010636272B2

(12) United States Patent
Zacchio et al.

(10) Patent No.: US 10,636,272 B2
(45) Date of Patent: Apr. 28, 2020

(54) TIME DOMAIN REFLECTOMETRY FOR ELECTRICAL SAFETY CHAIN CONDITION BASED MAINTENANCE

(71) Applicant: OTIS ELEVATOR COMPANY, Farmington, CT (US)

(72) Inventors: Joseph Zacchio, Wethersfield, CT (US); Teems E. Lovett, Glastonbury, CT (US); Paul R. Braunwart, Hebron, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 0 days.

(21) Appl. No.: 16/142,378

(22) Filed: Sep. 26, 2018

(65) Prior Publication Data

US 2020/0098237 A1 Mar. 26, 2020

(51) Int. Cl.
*G08B 21/18* (2006.01)
*G01R 31/11* (2006.01)
(52) U.S. Cl.
CPC .......... *G08B 21/182* (2013.01); *G01R 31/11* (2013.01)
(58) Field of Classification Search
CPC ....................... G08B 21/182; G01R 31/11
See application file for complete search history.

(56) References Cited

U.S. PATENT DOCUMENTS

| 6,446,760 | B1 | 9/2002 | Lisi |
| 7,264,090 | B2 | 9/2007 | Vecchiotti et al. |
| 9,580,276 | B2 | 2/2017 | Toutaoui |
| 9,988,239 | B2 | 6/2018 | Toutaoui |
| 10,012,696 | B2 | 7/2018 | Lustenberger |
| 2010/0141267 | A1* | 6/2010 | Quinn ..................... B66B 13/22 324/549 |
| 2015/0192906 | A1 | 7/2015 | Rogers et al. |
| 2016/0009526 | A1 | 1/2016 | Mertala et al. |
| 2016/0229667 | A1* | 8/2016 | Cereghetti ........... B66B 7/1223 |
| 2017/0261541 | A1 | 9/2017 | Herkel |
| 2017/0341906 | A1* | 11/2017 | Muller ................. B66B 5/0031 |
| 2017/0349398 | A1 | 12/2017 | Toutaoui |

FOREIGN PATENT DOCUMENTS

| EP | 1444161 B1 | 2/2006 |
| EP | 2349899 B1 | 4/2014 |
| WO | 2008110241 A2 | 9/2008 |
| WO | 2018019639 A1 | 2/2018 |

OTHER PUBLICATIONS

Al-Sharif, L. Topics in Escalator Electrical Design, Elevator Technology 6, Proceedings of the International Conference on Elevator Technology (Elevcon '95), Mar. 1995, Hong Kong, 11 Pages.

* cited by examiner

*Primary Examiner* — James J Yang
(74) *Attorney, Agent, or Firm* — Cantor Colburn LLP

(57) ABSTRACT

A method of examining an electrical safety chain of an elevator system including: emitting an electric pulse from a time-domain reflectometer into an electrical safety chain of an elevator system; detecting a reflected electric pulse reflected within the electrical safety chain using the time-domain reflectometer; comparing the reflected electric pulse to a baseline reflected electric pulse; and determining a degradation level in response to the reflected electric pulse and the baseline reflected electric pulse.

18 Claims, 6 Drawing Sheets

TIME DOMAIN REFLECTOMETRY FOR ELECTRICAL SAFETY CHAIN CONDITION BASED MAINTENANCE

BACKGROUND

The subject matter disclosed herein relates generally to the field of elevator systems, and specifically to a method and apparatus for evaluating an electrical safety chain of an elevator system.

Commonly, elevator systems employee electrical safety chain systems to enhance the safety of the overall elevator system. An electrical safety chain is a series switch connected electrical circuit used as a safety device to facilitate safe operation of the elevator. An electrical safety chain typically stretches over the length of the elevator shaft and the electrical safety chain has electrical switches located at each landing. The electrical switches are closed when the doors are closed at the landing, thus completing the electrical safety chain circuit. Whereas, the electrical switches open when the doors open at the landing, thus opening the electrical safety chain. The electrical safety chain circuit prevents motion of the elevator car when doors are open and the electrical safety chain is open. An electrically open electrical safety chain stops the operations of the overall elevator system. Electrically opening the electrical safety chain during elevator operation will result in an emergency stop of the elevator cab (car).

BRIEF SUMMARY

According to an embodiment, a method of examining an electrical safety chain of an elevator system is provided. The method including: emitting an electric pulse from a time-domain reflectometer into an electrical safety chain of an elevator system; detecting a reflected electric pulse reflected within the electrical safety chain using the time-domain reflectometer; comparing the reflected electric pulse to a baseline reflected electric pulse; and determining a degradation level in response to the reflected electric pulse and the baseline reflected electric pulse.

In addition to one or more of the features described herein, or as an alternative, further embodiments may include: activating an alarm when the degradation level is greater than a selected degradation level.

In addition to one or more of the features described herein, or as an alternative, further embodiments may include: determining a reflection time of the reflected electric pulse; comparing the reflection time to one or more baseline reflection times of the electrical safety chain; and determining a location within the electrical safety chain in response to the reflection time and the one or more baseline reflection times.

In addition to one or more of the features described herein, or as an alternative, further embodiments may include: determining the location is at an electrical switch, wherein the electrical switch further includes a first contact and a second contact, and wherein the electrical switch is operably connected to doors of an elevator system, such that when the doors open the first contact and the second contact separate to open an electrical circuit of the electrical safety chain.

In addition to one or more of the features described herein, or as an alternative, further embodiments may include: emitting a second electric pulse from a time-domain reflectometer into an electrical safety chain of an elevator system; detecting a second reflected electric pulse reflected within the electrical safety chain using the time-domain reflectometer; comparing the second reflected electric pulse to a second baseline reflected electric pulse; determining a second degradation level in response to the second reflected electric pulse and the second baseline reflected electric pulse; and determining a rate of degradation in response to the degradation level, the second degradation level, and a time period between the first degradation level and the second degradation level.

In addition to one or more of the features described herein, or as an alternative, further embodiments may include: activating an alarm when the degradation rate is greater than a selected degradation rate.

In addition to one or more of the features described herein, or as an alternative, further embodiments may include that the degradation level is a binary degradation level.

In addition to one or more of the features described herein, or as an alternative, further embodiments may include that the degradation level is a scale of degradation.

In addition to one or more of the features described herein, or as an alternative, further embodiments may include that the location is an electrical switch of the electrical safety chain or a location along the electrical safety chain.

According to another embodiment, a system for detecting degradation within an electrical safety chain of an elevator system is provided. The method system including: a processor; and a memory including computer-executable instructions that, when executed by the processor, cause the processor to perform operations, the operations including: emitting an electric pulse from a time-domain reflectometer into an electrical safety chain of an elevator system; detecting a reflected electric pulse reflected within the electrical safety chain using the time-domain reflectometer; comparing the reflected electric pulse to a baseline reflected electric pulse; and determining a degradation level in response to the reflected electric pulse and the baseline reflected electric pulse.

In addition to one or more of the features described herein, or as an alternative, further embodiments may include that the operations further include: activating an alarm when the degradation level is greater than a selected degradation level.

In addition to one or more of the features described herein, or as an alternative, further embodiments may include that the operations further include: determining a reflection time of the reflected electric pulse; comparing the reflection time to one or more baseline reflection times of the electrical safety chain; and determining a location of the electrical switch within the electrical safety chain in response to the reflection time and the one or more baseline reflection times.

In addition to one or more of the features described herein, or as an alternative, further embodiments may include that the operations further include: determining the location is at an electrical switch, wherein the electrical switch further includes a first contact and a second contact, and wherein the electrical switch is operably connected to doors of an elevator system, such that when the doors open the first contact and the second contact separate to open an electrical circuit of the electrical safety chain.

In addition to one or more of the features described herein, or as an alternative, further embodiments may include that the operations further include: emitting a second electric pulse from a time-domain reflectometer into an electrical safety chain of an elevator system; detecting a second reflected electric pulse reflected within the electrical safety chain using the time-domain reflectometer; comparing the second reflected electric pulse to a second baseline reflected electric pulse; determining a second degradation level in response to the second reflected electric pulse and the second baseline reflected electric pulse; and determining a rate of degradation in response to the degradation level, the second degradation level, and a time period between the first degradation level and the second degradation level.

In addition to one or more of the features described herein, or as an alternative, further embodiments may include that the operations further include: activating an alarm when the degradation rate is greater than a selected degradation rate.

In addition to one or more of the features described herein, or as an alternative, further embodiments may include that the degradation level is a binary degradation level.

In addition to one or more of the features described herein, or as an alternative, further embodiments may include that the degradation level is a scale of degradation.

In addition to one or more of the features described herein, or as an alternative, further embodiments may include that the location is an electrical switch of the electrical safety chain or a location along the electrical safety chain.

According to another embodiment, a computer program product tangibly embodied on a computer readable medium is provided. The computer program product including instructions that, when executed by a processor, cause the processor to perform operations including: emitting an electric pulse from a time-domain reflectometer into an electrical safety chain of an elevator system; detecting a reflected electric pulse reflected within the electrical safety chain using the time-domain reflectometer; comparing the reflected electric pulse to a baseline reflected electric pulse; and determining a degradation level in response to the reflected electric pulse and the baseline reflected electric pulse.

In addition to one or more of the features described herein, or as an alternative, further embodiments may include that the operations further include: activating an alarm when the degradation level is greater than a selected degradation level.

Technical effects of embodiments of the present disclosure include utilizing time-domain reflectometry to detect degradations in an electrical safety chain and localizing failed switches or physical breakages.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The present disclosure is illustrated by way of example and not limited in the accompanying figures in which like reference numerals indicate similar elements.

DETAILED DESCRIPTION

Figure 1:
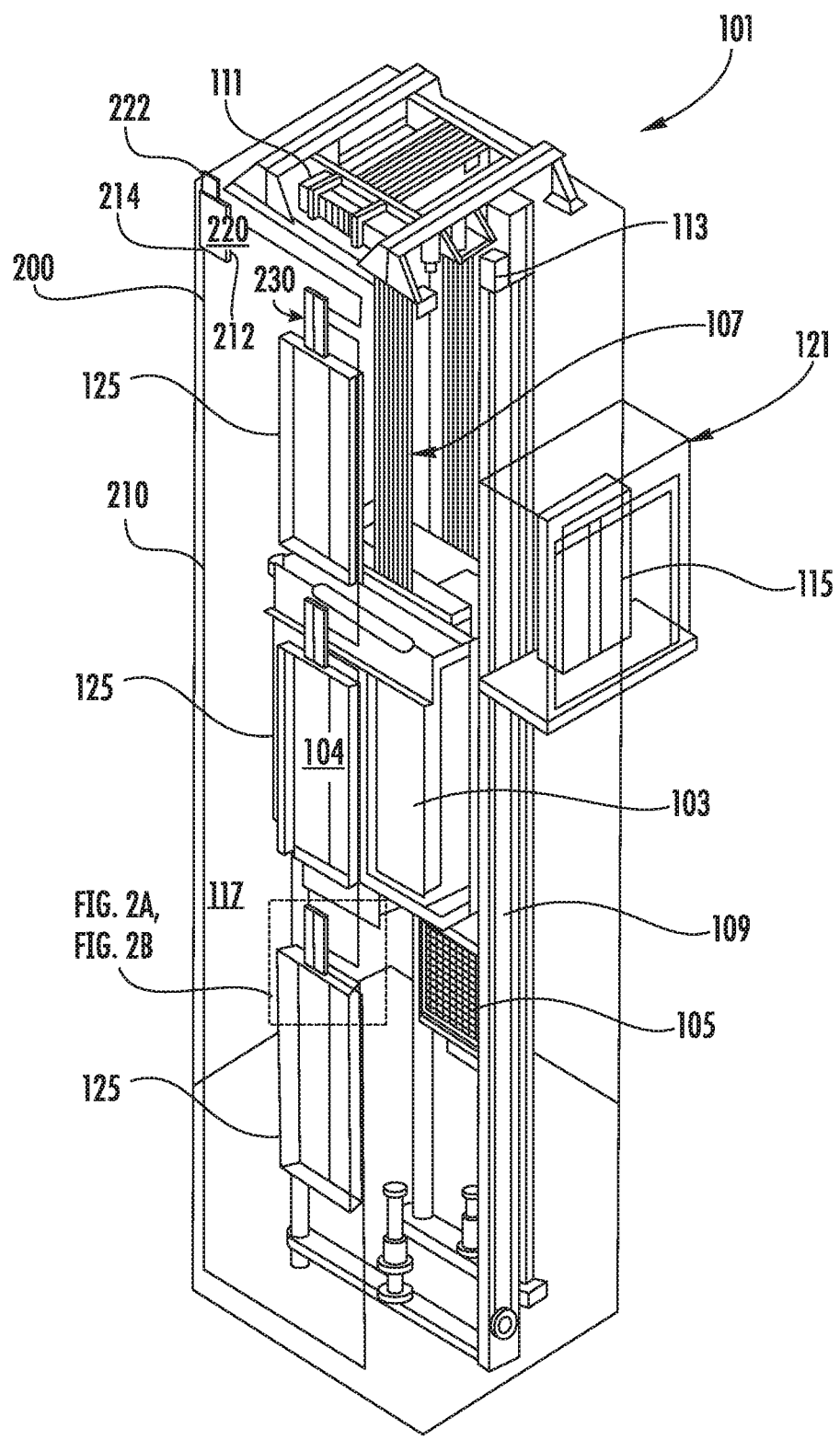
FIG. 1 is a schematic illustration of an elevator system that may employ various embodiments of the present disclosure.

FIG. 1 is a perspective view of an elevator system 101 including an elevator car 103, a counterweight 105, a tension member 107, a guide rail 109, a machine 111, a position reference system 113, and a controller 115. The elevator car 103 and counterweight 105 are connected to each other by the tension member 107. The tension member 107 may include or be configured as, for example, ropes, steel cables, and/or coated-steel belts. The counterweight 105 is configured to balance a load of the elevator car 103 and is configured to facilitate movement of the elevator car 103 concurrently and in an opposite direction with respect to the counterweight 105 within an elevator shaft 117 and along the guide rail 109.

The tension member 107 engages the machine 111, which is part of an overhead structure of the elevator system 101. The machine 111 is configured to control movement between the elevator car 103 and the counterweight 105. The position reference system 113 may be mounted on a fixed part at the top of the elevator shaft 117, such as on a support or guide rail, and may be configured to provide position signals related to a position of the elevator car 103 within the elevator shaft 117. In other embodiments, the position reference system 113 may be directly mounted to a moving component of the machine 111, or may be located in other positions and/or configurations as known in the art. The position reference system 113 can be any device or mechanism for monitoring a position of an elevator car and/or counter weight, as known in the art. For example, without limitation, the position reference system 113 can be an encoder, sensor, or other system and can include velocity sensing, absolute position sensing, etc., as will be appreciated by those of skill in the art.

The controller 115 is located, as shown, in a controller room 121 of the elevator shaft 117 and is configured to control the operation of the elevator system 101, and particularly the elevator car 103. For example, the controller 115 may provide drive signals to the machine 111 to control the acceleration, deceleration, leveling, stopping, etc. of the elevator car 103. The controller 115 may also be configured to receive position signals from the position reference system 113 or any other desired position reference device. When moving up or down within the elevator shaft 117 along guide rail 109, the elevator car 103 may stop at one or more landings 125 as controlled by the controller 115. Although shown in a controller room 121, those of skill in the art will appreciate that the controller 115 can be located and/or configured in other locations or positions within the elevator system 101. In one embodiment, the controller may be located remotely or in the cloud.

The machine 111 may include a motor or similar driving mechanism. In accordance with embodiments of the disclosure, the machine 111 is configured to include an electrically driven motor. The power supply for the motor may be any power source, including a power grid, which, in combination with other components, is supplied to the motor. The machine 111 may include a traction sheave that imparts force to tension member 107 to move the elevator car 103 within elevator shaft 117.

Although shown and described with a roping system including tension member 107, elevator systems that employ other methods and mechanisms of moving an elevator car within an elevator shaft may employ embodiments of the present disclosure. For example, embodiments may be employed in ropeless elevator systems using a linear motor to impart motion to an elevator car. Embodiments may also be employed in ropeless elevator systems using a hydraulic lift to impart motion to an elevator car. FIG. 1 is merely a non-limiting example presented for illustrative and explanatory purposes.

Figure 2A:
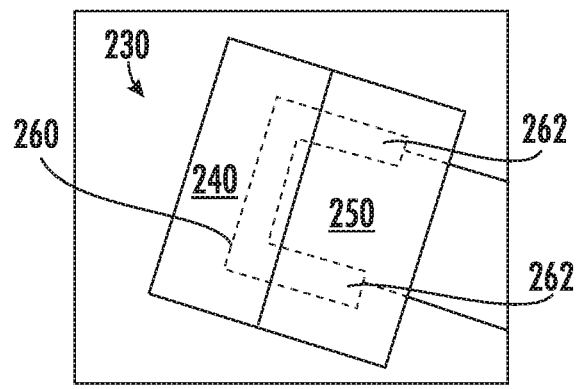
FIGS. 2a-2b are a schematic illustration of an electrical switch in an electrical safety chain for an elevator system of FIG. 1, according to an embodiment, of the present disclosure.
Figure 2B:
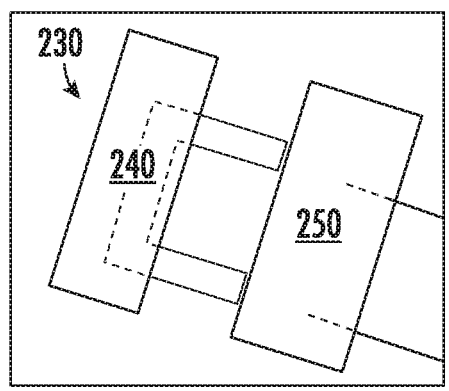

Referring now to FIGS. 1, 2a, and 2b, an electrical safety chain system 200 is illustrated. The elevator system 101 includes an electrical safety chain system 200 having a plurality of electrical switches 230 connected in series along the electrical safety chain 210. At least one electrical switch 230 is located at each landing 125, as shown in FIG. 1. The electrical safety chain 240 forms a complete electrical circuit from a start 212 to a finish 214. It is understood that FIG. 1 shows only a portion of the components included in wiring of the electrical safety chain 240 for clarity and thus some of the components of the electrical safety chain 240 are not shown, such as, for example relays or contactors that stop the drives and elevator. The start 212 of the electrical safety chain 210 is located at a controller 220 and the finish 214 of the electrical safety chain 210 may also be located at the controller 220.

As shown in FIGS. 2a and 2b, each electrical switch 230 includes a first contact 240 and a second contact 250. When the first contact 240 and the second contact 250 are in physical contact, as shown in FIG. 2a, electricity may pass between the first contact 240 and the second contact 250. As shown in FIGS. 2a and 2b, the electrical switch 230 may utilize a two-prong "U" shaped pin 260 to complete the electrical circuit. The two-prong "U" shaped pin 260 incorporates two prongs 262 that complete the electrical circuit of the electrical safety chain 210 when the first contact 240 and the second contact are in physical contact (i.e., close or come together). It is understood that the electrical switch 230 illustrated is an example and any electrical switch may be utilized with the embodiments disclosed herein. Further the electrical switches 230 may be located on the doors 104 of the elevator car 103 and/or the doors of each landing 125. However, when the first contact 240 and the second contact 250 are not in physical contact, as shown in FIG. 2b, electrical current may not pass between the first contact 240 and the second contact 250. A single electrical switch 230 having the first contact 240 and the second contact 250 that are not in physical contact may prevent electricity (e.g., an electric pulse) from traveling through the entire electrical safety chain 210.

An electrical switch 230 is located at each landing 125. The electrical switch 230 at each landing 125 is operably connected to the doors 104 of the elevator system 101 at the landing 125, such that when the doors 104 open the first contact 240 and the second contact 250 separate to open the electrical circuit of the electrical safety chain 210 but when the doors 104 close the first contact 240 and the second contact 250 physically touch to complete the electrical circuit of the electrical safety chain 210

When the electrical safety chain 210 is an open circuit (i.e., an electrical switch 203), the electrical safety chain system notifies the controller 115 of the elevator system 101. The electrical safety chain system 200 stops motion of the elevator car 103 when doors 104 are open and the electrical circuit of the electrical safety chain 210 is open. An electrical switch 230 providing a false open in the electrical safety chain 210 when the doors 104 at a landing 125 of the electrical switch 230 are closed inhibits the operation of the overall elevator system 101. Degradation of the electrical switches 230 may reduce, inhibit, and/or prevent the flow of electrical current through an electrical switch that has been degraded. The degradation will take form of increases or fluctuations in the electrical resistance of the switch over time. Degradation may include pitting, corrosion, cracks, debris build up on switch, mechanical degradation of the switch housing or mechanism, or any other degradation known to one of skill in the art.

Figure 3A:
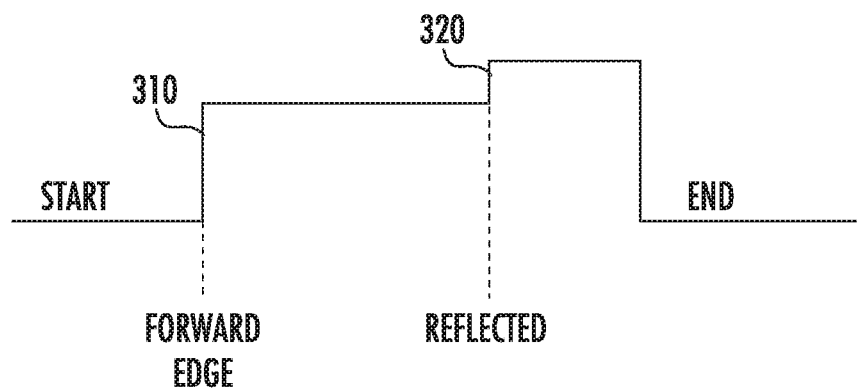
FIG. 3a is an illustration of transmitted and reflected electric pulses in an electrical safety chain for an elevator system of FIG. 1, according to an embodiment, of the present disclosure.

Referring now to FIGS. 1 and 3a-3h with continued reference to FIGS. 2a and 2b. The controller 220 includes a time-domain reflectometer 222. The time-domain reflectometer 222 is configured to transmit an electric pulse 310 (see FIG. 3a-3h) into the electrical safety chain 210. In an embodiment, the electric pulse 310 is a step pulse, as shown in FIG. 3a. In an embodiment, the electric pulse 310 may have the fastest possible rise time to not conflict with initial reflections and the duration of the electric pulse 310 may need to last long enough for the reflections from the furthest away electrical switch 230 or the end of the electrical safety chain 210. It is understood that other types of electric pulses may be utilized and the embodiments disclosed herein are not limited to step pulses. In another embodiment, multiple electric pulses 310 may be utilized at selected frequencies. Advantageously, combinations of multiple pulses to improve the resolution of the reflection or clean up ghost reflections.

The electric pulse 310 transmitted by the time-domain reflectometer 222 into the electrical safety chain 210 results in a reflected electric pulse 320 indicative of a degradation level of each electrical switch 230. The degradation level may be a binary indication of degradation (e.g., either degradation is present or not) or a scale of degradation (e.g., on a scale of "1-10" how bad is the degradation with "10" being the worst degradation possible and "1" being no degradation present). Degradation of the electrical switch 230 increases the resistance for the electrical switch 230. If there is no degradation in an electrical switch 230 then then an electric pulse 310 may travel through the electrical switch 230 only slightly impeded by the normal resistance (i.e., baseline resistance) of the electrical switch 230. As the electrical switch 230 degrades then a magnitude of the reflected electric pulse 320 will change. An "open" or highly degraded electrical switch 230 that is falsely reporting as open may reflect a reflected electric pulse 320 about equal in magnitude (when accounting for normal baseline transmission losses in the electrical safety chain 210) to the electric pulse 310 transmitted from the time-domain reflectometer 222. An electric pulse 310 may be transmitted through the electrical safety chain 210 at a desired voltage and if a magnitude of the reflected electric pulse 320 for a particular electrical switch is continually changing, then the electrical switch 230 may need to be cleaned or replaced at a certain magnitude of the reflected electric pulse 320. Additional reflected electric pulses 320 of growing amplitude result from degradation. This amplitude of the reflected electric pulse 320 will increase until the electrical safety chain 210 opens.

Figure 3B:
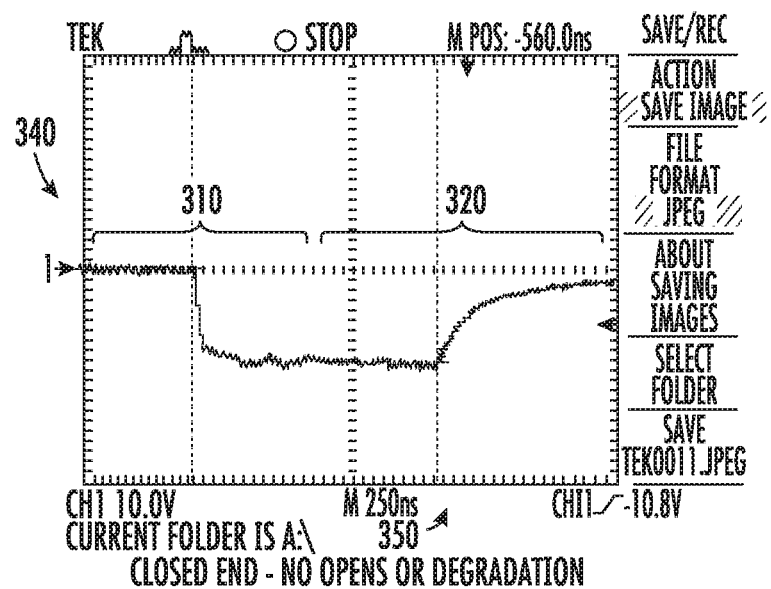
FIGS. 3b-3h are an oscilloscope screen shot of transmitted electric pulses and reflected electric pulses within an electrical safety chain of FIG. 1, according to an embodiment, of the present disclosure.
Figure 3C:
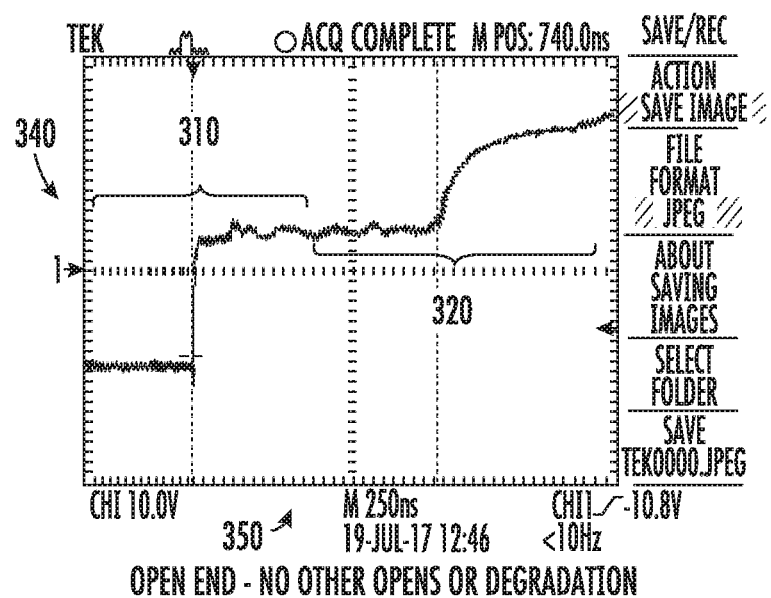
Figure 3D:
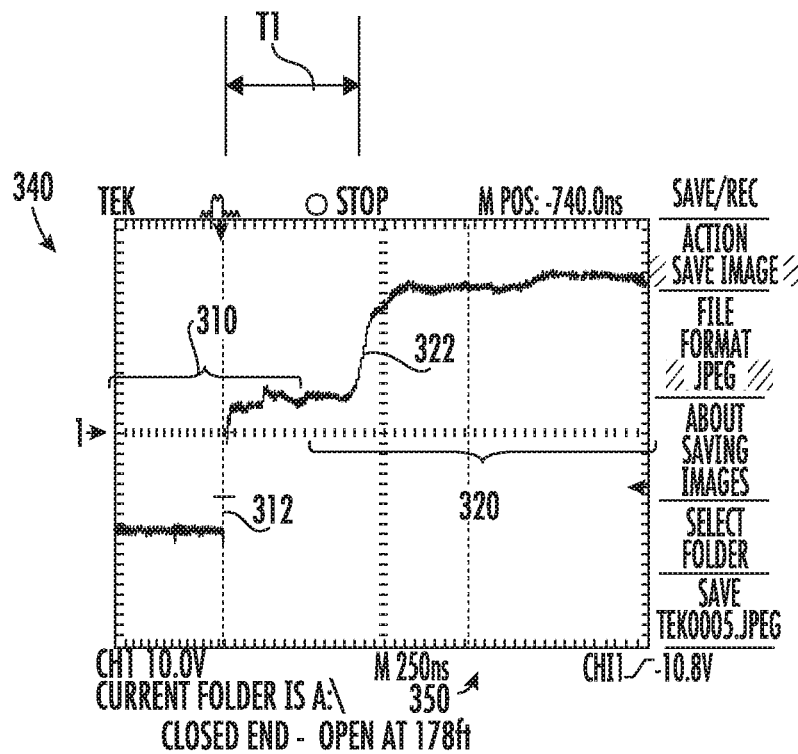
Figure 3E:
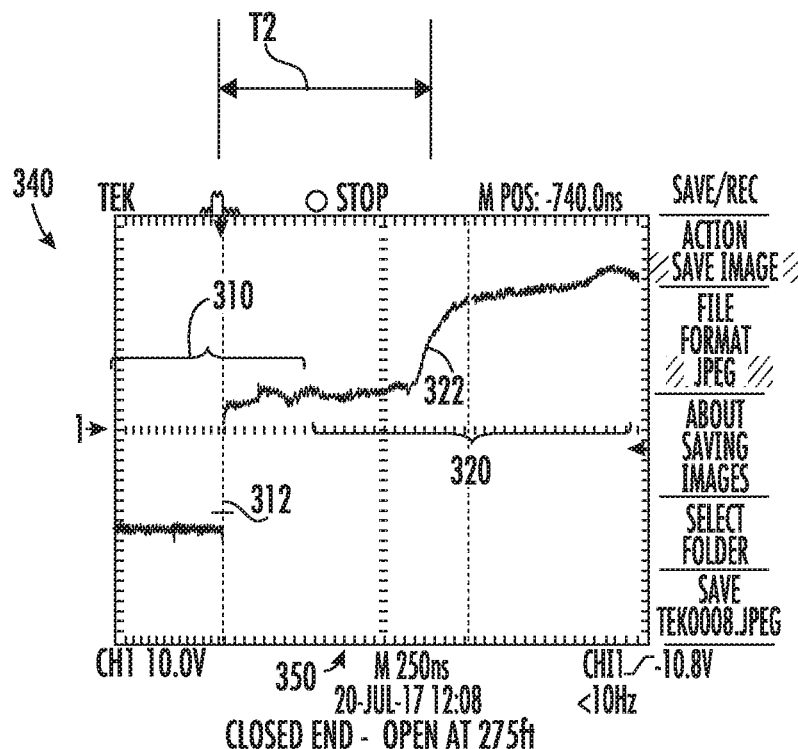

FIGS. 3b-3h illustrated various examples of the data that may be gleamed using the time-domain reflectometer 222. All of the charts illustrated in FIGS. 3b-3h illustrate the electric pulse 310 and the reflected electric pulse 320 on a voltage 340 versus time 350 chart. FIG. 3b illustrates a "closed end" system having no opens or degradation, thus the reflected electric pulse 320 appears about equivalent to the electric pulse 310 transmitted from the time-domain reflectometer 222. FIG. 3c illustrates an "open end" system having no opens or degradation, thus the reflected electric pulse 320 appears inverted but about equivalent to the electric pulse 310 transmitted from the time-domain reflectometer 222. FIGS. 3d and 3e illustrates how the time T1, T2 it takes for an electric pulse 310 to be reflected back, may be used to determine physical distance between electrical switches 230. As may be seen in FIGS. 3d and 3e, the second reflection time T2 is greater than the first reflection time T1, thus the electrical switch 330 causing the second reflection time T2 may be determined to be closer to the time-domain reflectometer 222 than the electrical switch 330 causing the first reflection time T1. The reflection times T1, T2 may be the time between the step point 312 of the electric pulse 310 and the step point 322 of the reflected electric pulse 320. A commissioning run may occur when the electrical safety chain 210 is first installed to determine the baseline reflection time of each electrical switch 230 along the electrical safety chain 210. To determine the timing associated with electrical switch's 230 reflection (e.g., reflected electric pulse 320), a commissioning run (i.e., learning run) may be used. This information is stored after the commissioning run to identify which electrical switch 230 is creating the reflected electric pulses 320 captured after the electric pulse 310. The commissioning run may involve opening each electrical switch 310 one after the other combined with an electric pulse 310 timed to identify the timing of the reflected electric pulses 320 from each electrical switch 230 when the electrical switch 310 is in the open position.

Figure 3F:
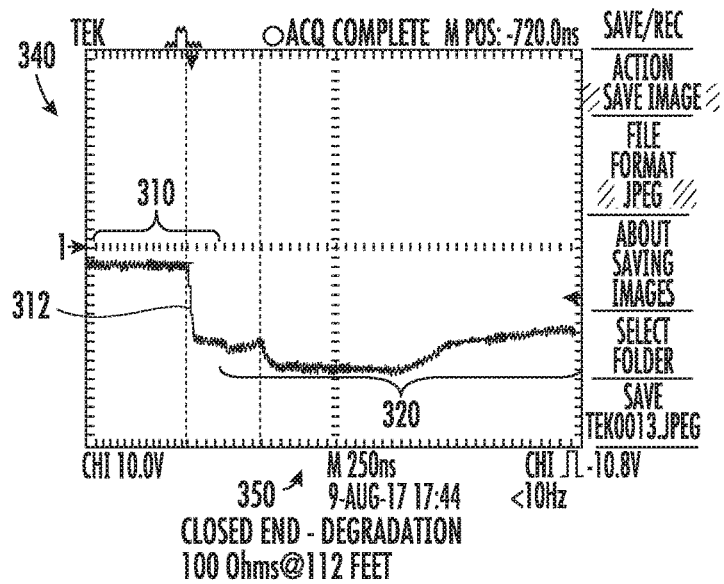
Figure 3G:
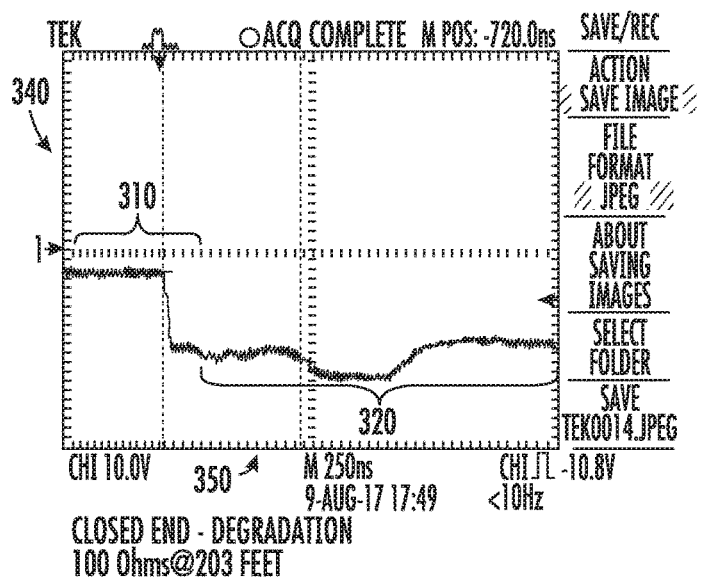
Figure 3H:
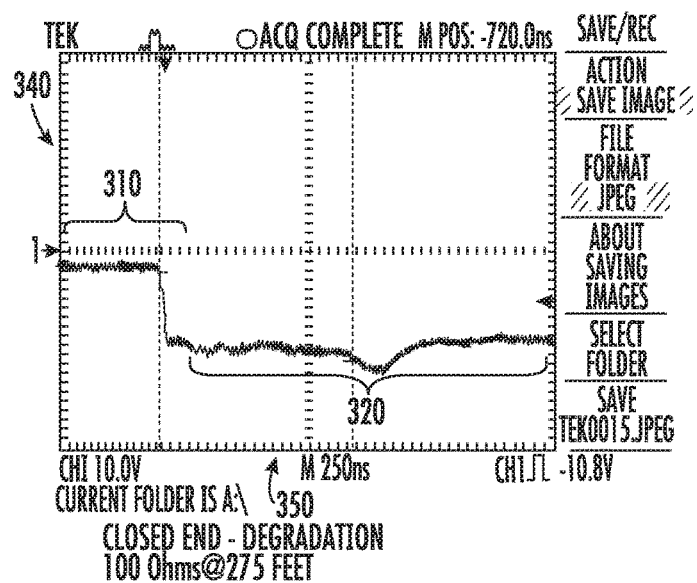

FIGS. 3f, 3g, and 3h show the smaller reflected pulses 320 from degraded electrical switch 230 with increased resistance. The time from the pulse edge (i.e., step point 312) to reflected pulse 320 localizes where the degradation is located. FIG. 3F shows a degradation reflected pulse 320 from 112 feet into the electrical safety chain 210. FIG. 3g show a degradation reflected pulse 320 from 203 feet into the electrical safety chain 210. FIG. 3h show a degradation reflected pulse 320 from 275 feet into the electrical safety chain 210. The size of this reflected pulse 320 would increase with increased degradation. FIGS. 3f, 3g, and 3h show a fixed level of degradation at 100 ohms.

Figure 4:
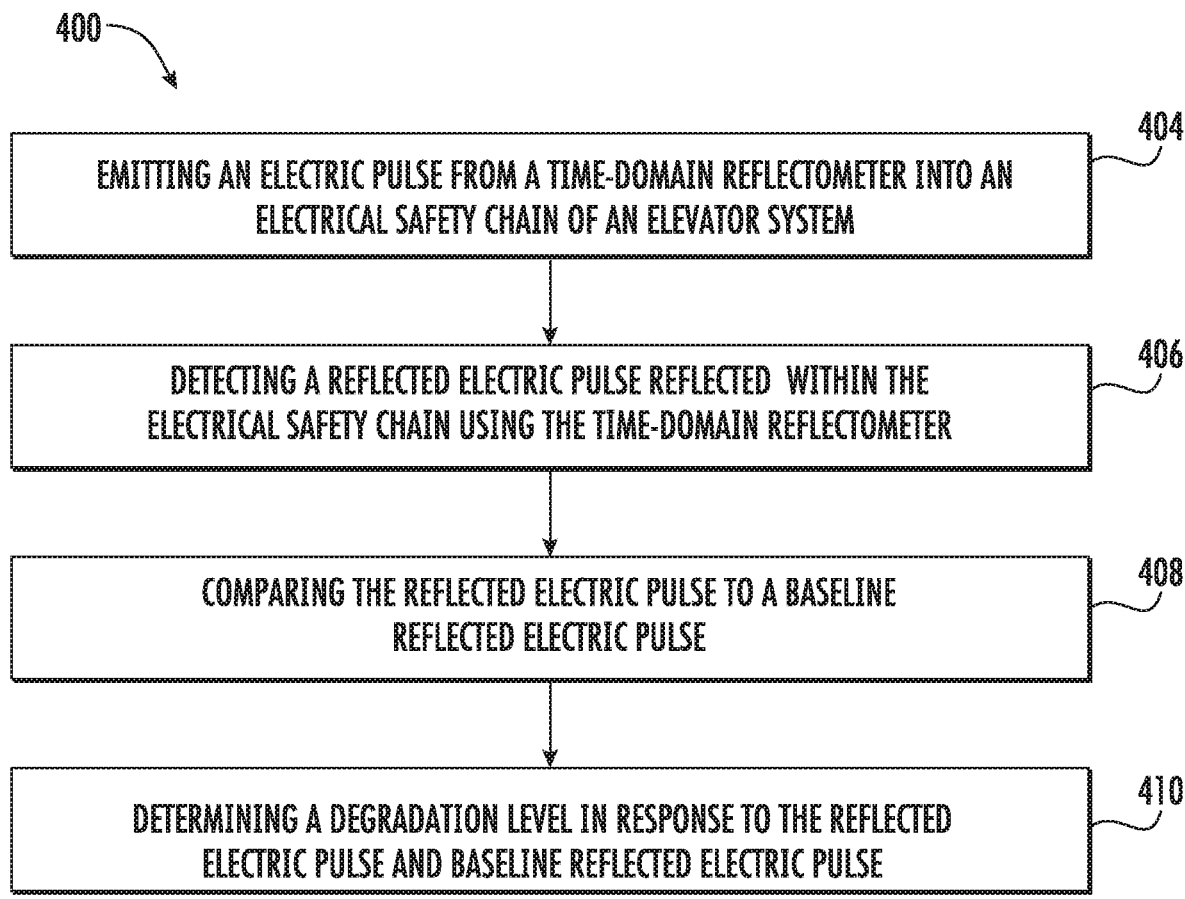
FIG. 4 is a flow chart of method of examining an electrical safety chain of the elevator system of FIG. 1, in accordance with an embodiment of the disclosure.

Referring now to FIG. 4, while referencing components of FIGS. 1, 2a, 2b, and 3a-3h. FIG. 4 shows a flow chart of a method 300 of examining an electrical safety chain 210 of an elevator system 101. Examining may include detecting degradation of electrical switches 230, open electrical switches 230, or broken wires of the electrical safety chain 210. In an embodiment, the method 300 may be performed by the controller 220 of the electrical safety chain system 200.

At block 404, an electric pulse 310 is emitted from a time-domain reflectometer 222 into an electrical safety chain 210 of an elevator system 101. At block 406, a reflected electric pulse 320 reflected within the electrical safety chain 210 is detected using the time-domain reflectometer 222. At block 408, the reflected electric pulse 320 is compared to a baseline reflected electric pulse, which may be have collected during a commissioning run (i.e., learning run). At block 410, a degradation level is determined in response to the reflected electric pulse 320 and the baseline reflected electric pulse. The degradation level may be of a specific electrical switch.

The method 400 may further include: activating an alarm when the degradation level is greater than a selected degradation level. The alarm may be audible, visual, and/or vibratory. The alarm may be a text message, email, notification, or alert received on a computing device.

Additionally, the method 400 may also determine which electrical switch 230 is reporting the degradation level determined at block 410 or where in the electrical safety chain 210 the degradation is being determined (e.g., a break in the wire of the electrical safety chain). Upon initial installation of the electrical safety chain system 200, the location of each electrical switch 230 may be associated with a reflection time T1, T2 of each electrical switch 230. The initial reflection times captured upon installation of the electrical safety chain system 200 may be considered baseline reflection times that future reflection times may be compared to in order to identify what electrical switch 230 is producing the reflected electrical signal 320. Therefore, the method 400 may include: determining a reflection time of the reflected electric pulse 320; comparing the reflection time 320 to one or more baseline reflection times of the electrical safety chain 210; and determining a location within the electrical safety chain 220 in response to the reflection time and the one or more baseline reflection times. The location may be at an electrical switch of the electrical safety chain (i.e., identifying the specific electrical switch 230 or the location of the electrical switch 230 or a location along the electrical safety chain 210.

Furthermore the method 400 may also determine a rate of degradation for an electrical switch 230 by monitoring the degradation level over a period of time. Therefore, the method 400 may also include: emitting a second electric pulse 310 from a time-domain reflectometer 222 into an electrical safety chain 210 of an elevator system 101; detecting a second reflected electric pulse 320 reflected within the electrical safety chain 210 using the time-domain reflectometer 222; comparing the second reflected electric pulse 320 to a second baseline electric pulse, which may be have collected during a commissioning run (i.e., learning run); determining a second degradation level in response to the second reflected electric pulse 320 and the second electric pulse 310 transmitted from the time-domain reflector 222; and determining a rate of degradation in response to the degradation level, the second degradation level, and a time period. An alarm may be activated when the degradation rate is greater than a selected degradation rate. The alarm may be audible, visual, and/or vibratory. The alarm may be a text message, email, notification, or alert received on a computing device. The second baseline electric pulse may be the first baseline electric pulse.

While the above description has described the flow process of FIG. 4 in a particular order, it should be appreciated that unless otherwise specifically required in the attached claims that the ordering of the steps may be varied.

As described above, embodiments can be in the form of processor-implemented processes and devices for practicing those processes, such as a processor. Embodiments can also be in the form of computer program code containing instructions embodied in tangible media, such as network cloud storage, SD cards, flash drives, floppy diskettes, CD ROMs, hard drives, or any other computer-readable storage medium, wherein, when the computer program code is loaded into and executed by a computer, the computer becomes a device for practicing the embodiments. Embodiments can also be in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an device for practicing the embodiments. When implemented on a general-purpose microprocessor, the computer program code segments configure the microprocessor to create specific logic circuits.

The term "about" is intended to include the degree of error associated with measurement of the particular quantity and/or manufacturing tolerances based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A method of examining an electrical safety chain of an elevator system, the method comprising:
    emitting an electric pulse from a time-domain reflectometer into an electrical safety chain of an elevator system;
    detecting a reflected electric pulse reflected within the electrical safety chain using the time-domain reflectometer;
    comparing the reflected electric pulse to a baseline reflected electric pulse;
    determining a degradation level in response to the reflected electric pulse and the baseline reflected electric pulse;
    emitting a second electric pulse from a time-domain reflectometer into an electrical safety chain of an elevator system;
    detecting a second reflected electric pulse reflected within the electrical safety chain using the time-domain reflectometer;
    comparing the second reflected electric pulse to a second baseline reflected electric pulse;
    determining a second degradation level in response to the second reflected electric pulse and the second baseline reflected electric pulse; and
    determining a rate of degradation in response to the degradation level, the second degradation level, and a time period between the degradation level and the second degradation level.

2. The method of claim 1, further comprising:
    activating an alarm when the degradation level is greater than a selected degradation level.

3. The method of claim 1, further comprising:
    determining a reflection time of the reflected electric pulse;
    comparing the reflection time to one or more baseline reflection times of the electrical safety chain; and
    determining a location within the electrical safety chain in response to the reflection time and the one or more baseline reflection times.

4. The method of claim 3, further comprising:
    determining the location is at an electrical switch, wherein the electrical switch further comprises a first contact and a second contact, and wherein the electrical switch is operably connected to doors of an elevator system, such that when the doors open the first contact and the second contact separate to open an electrical circuit of the electrical safety chain.

5. The method of claim 1, further comprising:
    activating an alarm when the degradation rate is greater than a selected degradation rate.

6. The method of claim 1, wherein the degradation level is a binary degradation level.

7. The method of claim 1, wherein the degradation level is a scale of degradation.

8. The method of claim 3, wherein the location is an electrical switch of the electrical safety chain or a location along the electrical safety chain.

9. A system for detecting degradation within an electrical safety chain of an elevator system, the method comprising:
    a processor; and
    a memory comprising computer-executable instructions that, when executed by the processor, cause the processor to perform operations, the operations comprising:
    emitting an electric pulse from a time-domain reflectometer into an electrical safety chain of an elevator system;
    detecting a reflected electric pulse reflected within the electrical safety chain using the time-domain reflectometer;
    comparing the reflected electric pulse to a baseline reflected electric pulse;
    determining a degradation level in response to the reflected electric pulse and the baseline reflected electric pulse;
    emitting a second electric pulse from a time-domain reflectometer into an electrical safety chain of an elevator system;
    detecting a second reflected electric pulse reflected within the electrical safety chain using the time-domain reflectometer;
    comparing the second reflected electric pulse to a second baseline reflected electric pulse;
    determining a second degradation level in response to the second reflected electric pulse and the second baseline reflected electric pulse; and determining a rate of degradation in response to the degradation level, the second degradation level, and a time period between the degradation level and the second degradation level.

10. The system of claim 9, wherein the operations further comprise:
activating an alarm when the degradation level is greater than a selected degradation level.

11. The system of claim 9, wherein the operations further comprise:
determining a reflection time of the reflected electric pulse;
comparing the reflection time to one or more baseline reflection times of the electrical safety chain; and
determining a location of the electrical switch within the electrical safety chain in response to the reflection time and the one or more baseline reflection times.

12. The system of claim 11, wherein the operations further comprise:
determining the location is at an electrical switch, wherein the electrical switch further comprises a first contact and a second contact, and wherein the electrical switch is operably connected to doors of an elevator system, such that when the doors open the first contact and the second contact separate to open an electrical circuit of the electrical safety chain.

13. The system of claim 9, wherein the operations further comprise:
activating an alarm when the degradation rate is greater than a selected degradation rate.

14. The system of claim 9, wherein the degradation level is a binary degradation level.

15. The system of claim 9, wherein the degradation level is a scale of degradation.

16. The system of claim 11, wherein the location is an electrical switch of the electrical safety chain or a location along the electrical safety chain.

17. A computer program product tangibly embodied on a non-transitory computer readable medium, the computer program product including instructions that, when executed by a processor, cause the processor to perform operations comprising:
emitting an electric pulse from a time-domain reflectometer into an electrical safety chain of an elevator system;
detecting a reflected electric pulse reflected within the electrical safety chain using the time-domain reflectometer;
comparing the reflected electric pulse to a baseline reflected electric pulse;
determining a degradation level in response to the reflected electric pulse and the baseline reflected electric pulse;
emitting a second electric pulse from a time-domain reflectometer into an electrical safety chain of an elevator system;
detecting a second reflected electric pulse reflected within the electrical safety chain using the time-domain reflectometer;
comparing the second reflected electric pulse to a second baseline reflected electric pulse;
determining a second degradation level in response to the second reflected electric pulse and the second baseline reflected electric pulse; and
determining a rate of degradation in response to the degradation level, the second degradation level, and a time period between the degradation level and the second degradation level.

18. The computer program product of claim 17, wherein the operations further comprise:
activating an alarm when the degradation level is greater than a selected degradation level.

* * * * *